US009634246B2

(12) United States Patent
Lee

(10) Patent No.: US 9,634,246 B2
(45) Date of Patent: Apr. 25, 2017

(54) ELECTRONIC DEVICE AND METHOD FOR FABRICATING THE SAME

(71) Applicant: SK hynix Inc., Icheon (KR)

(72) Inventor: Woo-Tae Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 92 days.

(21) Appl. No.: 14/856,488

(22) Filed: Sep. 16, 2015

(65) Prior Publication Data

US 2016/0284992 A1   Sep. 29, 2016

(30) Foreign Application Priority Data

Mar. 25, 2015   (KR) .................... 10-2015-0041470

(51) Int. Cl.
| G11C 11/00 | (2006.01) |
| H01L 45/00 | (2006.01) |
| H01L 27/24 | (2006.01) |
| G06F 12/0875 | (2016.01) |
| G06F 13/16 | (2006.01) |

(52) U.S. Cl.
CPC .......... *H01L 45/08* (2013.01); *G06F 12/0875* (2013.01); *G06F 13/1673* (2013.01); *H01L 27/249* (2013.01); *H01L 27/2427* (2013.01); *H01L 45/1226* (2013.01); *H01L 45/1253* (2013.01); *H01L 45/146* (2013.01); *H01L 45/1608* (2013.01); *G06F 2212/451* (2013.01); *G06F 2212/452* (2013.01)

(58) Field of Classification Search
CPC ............ G11C 13/0069; G11C 13/0004; G11C 11/5678; G11C 11/5685
USPC ..................... 365/148, 163, 185.11
See application file for complete search history.

(56) References Cited

U.S. PATENT DOCUMENTS

2014/0268995 A1*   9/2014   Joo ..................... H01L 45/06
                                                                   365/148

FOREIGN PATENT DOCUMENTS

KR   10-2012-0097594 A   9/2012

* cited by examiner

*Primary Examiner* — Huan Hoang

(57) ABSTRACT

An electronic device includes a semiconductor memory. The semiconductor memory includes a vertical electrode layer formed over a substrate and extending in a vertical direction substantially perpendicular to a surface of the substrate; an interlayer dielectric layer and a structure formed over the substrate and alternately stacked along the vertical electrode layer, wherein the structure includes a horizontal electrode layer and a base layer which is conductive and located over or under the horizontal electrode layer; a variable resistance layer interposed between the vertical electrode layer and the base layer, and including a common element with the base layer; and a groove interposed between the vertical electrode layer and the horizontal electrode layer and insulating the vertical electrode layer and the horizontal electrode layer from each other.

26 Claims, 15 Drawing Sheets

ELECTRONIC DEVICE AND METHOD FOR FABRICATING THE SAME

CROSS-REFERENCE TO RELATED APPLICATION

The present application claims priority to Korean Patent Application No. 10-2015-0041470, entitled "ELECTRONIC DEVICE AND METHOD FOR FABRICATING THE SAME" and filed on Mar. 25, 2015, which is incorporated by reference herein in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device can improve a data storage characteristic and an operating characteristic of a semiconductor memory.

In an embodiment, an electronic device includes a semiconductor memory that comprises a vertical electrode layer formed over a substrate and extending in a vertical direction substantially perpendicular to a surface of the substrate; an interlayer dielectric layer and a structure formed over the substrate and alternately stacked along the vertical electrode layer, wherein the structure includes a horizontal electrode layer and a base layer which is conductive and located over or under the horizontal electrode layer; a variable resistance layer interposed between the vertical electrode layer and the base layer, and including a common element with the base layer; and a groove interposed between the vertical electrode layer and the horizontal electrode layer and insulating the vertical electrode layer and the horizontal electrode layer from each other.

Embodiments of the above device may include one or more of the following.

The horizontal electrode layer is formed of a material having an etching rate different from an etching rate of the base layer. The groove is in a vacuum state or filled with a gas. The groove is filled with an insulating material. The base layer includes a metal, and the variable resistance layer includes an oxide of the metal. The oxide of the metal is deficient in oxygen compared to a stoichiometric metal oxide. A width of the groove is larger than a width of the variable resistance layer in a horizontal direction substantially parallel to the surface of the substrate. The vertical electrode layer has a first side surface and a second side surface facing with each other, and the variable resistance layer coupled to the first side surface and the variable resistance layer coupled to the second side surface are separated from each other so as to form different memory cells. The variable resistance layer includes a first layer adjacent to the base layer and a second layer adjacent to the vertical electrode layer, and the first layer includes the common element with the base layer. One of the first layer and the second layer includes a first metal oxide that satisfies a stoichiometric ratio, and the other of the first layer and the second layer includes a second metal oxide that is deficient in oxygen compared to a stoichiometric metal oxide. The first layer is formed at a substantially same level as the base layer in the vertical direction, and the second layer is formed along the vertical electrode layer so as to extend in the vertical direction. The semiconductor memory further comprising: a selection element layer interposed between the variable resistance layer and the vertical electrode layer, and having a threshold switching characteristic. The selection element layer is formed along the vertical electrode layer so as to extend in the vertical direction. The base layer is in a floating state, and the horizontal electrode layer is coupled to a voltage supplier.

In another embodiment, a method of manufacturing an electronic device comprising a semiconductor memory comprises alternately stacking an interlayer dielectric layer and a structure over a substrate, wherein the structure includes a horizontal electrode layer and a base layer which is conductive and located over or under the horizontal electrode layer; forming an opening by selectively etching the interlayer dielectric layer and the structure; forming a groove by removing a portion of the horizontal electrode layer exposed by the opening; changing a portion of the base layer exposed by the opening to a variable resistance layer; and forming a vertical electrode layer filling at least a portion of the opening.

Embodiments of the above method may include one or more of the following.

The forming of the groove is performed by an isotropic etching process. The method further comprises forming an insulating material the base layer includes a metal, and the changing of the portion of the base layer is performed by an oxidation process. The opening has a line shape or a hole shape. The method further comprises forming an additional variable resistance layer over a sidewall of the opening after the changing of the portion of the base layer. The method further comprises forming a selection element layer over a sidewall of the opening after the changing of the portion of the base layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is a part of the memory or the buffer memory in the memory system.

These and other aspects, implementations and associated advantages are described will become apparent in view of the drawings and the description of embodiments provided herein, which are intended to provide further explanation of the invention as claimed.

DETAILED DESCRIPTION

Figure 1:
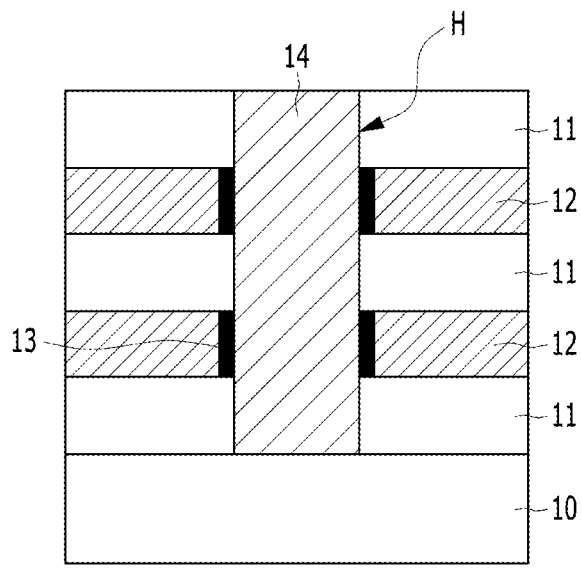
FIG. 1 is a cross-sectional view illustrating a semiconductor device in accordance with a comparative example and a problem thereof.

Various embodiments of the present disclosure will be described below with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers exist between the first layer and the second layer or the substrate.

Prior to describing implementations, a semiconductor device in accordance with a comparative example and a problem thereof will be described with reference to FIG. 1.

FIG. 1 is a cross-sectional view illustrating a semiconductor device in accordance with a comparative example.

Referring to FIG. 1, the semiconductor device of the comparative example may include a vertical electrode 14 formed over a substrate 10 and extending in a vertical direction perpendicular to a surface of the substrate 10, an interlayer dielectric layer 11 and a horizontal electrode layer 12 formed over the substrate 10 and alternately stacked along the vertical electrode 14, and a variable resistance element 13 interposed between the horizontal electrode layer 12 and the vertical electrode 14 and switched between different resistance states according to a voltage or current supplied through the horizontal electrode layer 12 and the vertical electrode 14. For example, the variable resistance element 13 may include a metal oxide containing a large amount of oxygen vacancies and having a resistance value that changes according to whether a filament current path is present or absent in the metal oxide.

The variable resistance element 13 may be formed by oxidizing a sidewall of the horizontal electrode layer 12 exposed by a hole H before forming the vertical electrode 14. In this case, it is necessary for the variable resistance element 13 to be an oxide of a material which forms the horizontal electrode layer 12. The material limitation for the horizontal electrode layer 12 is based on memory characteristics such as a signal delay, etc. Therefore, a problem exists that various materials more suitable for the variable resistance element 13 cannot be used without compromising performance.

In implementations of this disclosure, a material used as a horizontal electrode layer and a material used as a variable resistance element may be independent of each other. So, various materials may be used for the variable resistance element regardless of the material used for the horizontal electrode layer.

Figure 2A:
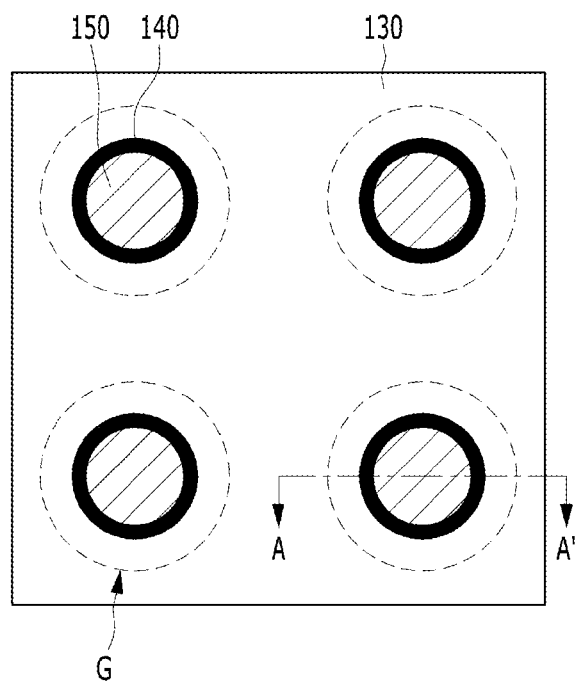
FIG. 2A is a planar view illustrating a semiconductor device in accordance with an implementation.
Figure 2B:
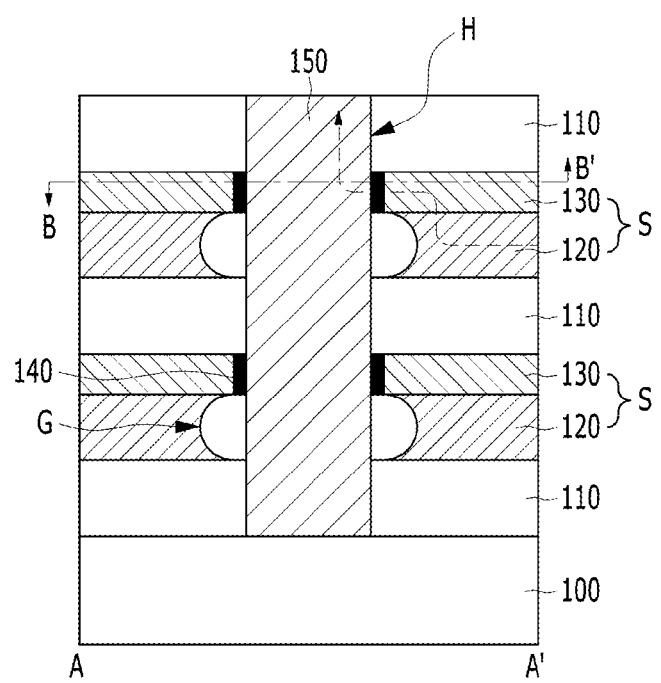
FIG. 2B is a cross-sectional view taken along a line A-A' of FIG. 2A.

FIG. 2A is a planar view illustrating a semiconductor device in accordance with an implementation, and FIG. 2B is a cross-sectional view taken along a line A-A' of FIG. 2A. In particular, FIG. 2A is shown at a height of a line B-B' of FIG. 2B.

Referring to FIGS. 2A and 2B, the semiconductor device of this implementation may include a vertical electrode 150 formed over a substrate 100 and extending in a vertical direction perpendicular to a surface of the substrate 100, an interlayer dielectric layer 110 and a structure S formed over the substrate 100. The structure S includes a stacked structure of a horizontal electrode layer 120 and a base layer 130 which is conductive and can be changed to a variable resistance material by a certain treatment, and a variable resistance element 140 interposed between the base layer 130 and the vertical electrode 150. The stacked structure S is alternately stacked with interlayer dielectric layer 110 along the vertical electrode 150. The device further includes a groove G interposed between the horizontal electrode layer 120 and the vertical electrode 150.

The vertical electrode 150 may be coupled to one end of the variable resistance element 140, for example, an inner sidewall of the variable resistance element 140, and supply a voltage or current to the variable resistance element 140. The vertical electrode 150 may include a conductive material such as a metal, a metal nitride, etc. In particular, a material which has an excellent gap-fill property and a low resistance value, such as W, TiN and the like may be used as the vertical electrode 150. Such materials may be used to facilitate forming the vertical electrode 150 and reduce a signal delay. The vertical electrode 150 may have a pillar shape. A plurality of vertical electrodes 150 may be arranged in a matrix, or array, in a horizontal plane parallel to the upper surface of the substrate 100. In FIG. 2A, four vertical electrodes 150 are shown. However, a number and an arrangement of the vertical electrodes 150 may vary in different implementations.

A stack structure of the interlayer dielectric layer 110 and the structure S may surround a sidewall of the vertical electrode 150. The interlayer dielectric layer 110 may insulate a lower structure S from an upper structure S which is adjacent to the lower structure S in the vertical direction. The interlayer dielectric layer 110 may include an insulating material, such as a silicon oxide, a silicon nitride, a combination thereof, etc. The structure S may include the horizontal electrode layer 120 and the base layer 130 which are sequentially stacked. However, in other implementations, the order of horizontal electrode layer 120 and the base layer 130 may be reversed so that base layer 130 is disposed above horizontal electrode layer 120 in structure S.

In FIG. 2B, two structures S and three interlayer dielectric layers 110 are shown. However, other implementations may include other numbers of the structure S and the interlayer dielectric layer 110 for a given vertical electrode 150. The interlayer dielectric layer 110 may be interposed between two adjacent structures S in the vertical direction so as to insulate the two adjacent structures S from each other. Also, an interlayer dielectric layer 110 may be located over an uppermost structure S so as to insulate the uppermost structure S from a conductive material (not shown) located above, for example, a bit line. Also, the interlayer dielectric layer 110 may be located under a lowermost structure S so as to insulate the lowermost structure S from conductive elements (not shown) formed in the substrate 100.

The horizontal electrode layer 120 may be coupled to the other end of the variable resistance element 140, for example, an outer sidewall of the variable resistance element 140, and serve as supplying a required voltage or current to the variable resistance element 140. The horizontal electrode layer 120 may include a conductive material such as a metal, a metal nitride, etc. In particular, similar to the vertical electrode 150, a material having a low resistance value may be used as the horizontal electrode layer 120 in order to reduce a signal delay. The horizontal electrode layer 120 may not be in a direct contact with the variable resistance element 140. That is, the horizontal electrode layer 120 may be electrically coupled to the variable resistance element 140 via the base layer 130. The horizontal electrode layer 120 may be formed of a material having an etching rate different from an etching rate of the base layer 130. That is, horizontal electrode layer 120 may have a much lower etching rate compared to the base layer 130 when using a certain etching gas or chemical.

The groove G may be interposed between the horizontal electrode layer 120 and the vertical electrode 150. An inside of the groove G may be an empty space. That is, the groove G may be in a vacuum state or filled with a certain gas which is used in processing steps. The gas filled in the groove G may have a dielectric constant substantially same as or larger than a dielectric constant of vacuum. Therefore, the horizontal electrode layer 120 and the vertical electrode 150 may be electrically insulated from each other by the groove G. The groove G may be formed by removing a portion of the horizontal electrode layer 120, so that the groove G is located at a same level as the horizontal electrode layer 120 in the vertical direction and has a same thickness as the horizontal electrode layer 120. Also, the groove G may have a ring shape surrounding a sidewall of the vertical electrode 150, and a width of the groove G may have a value such that can insulate the horizontal electrode layer 120 and the vertical electrode 150 from each other. Furthermore, when the horizontal electrode layer 120 is not in direct contact with the variable resistance element 140, a width of an uppermost portion of the groove G, that is, a width of a portion of the groove G adjacent to the base layer 130 may be larger than a width of the variable resistance element 140. Although not shown, the groove G may be filled with an insulating material such as a silicon oxide, a silicon nitride, a combination thereof, etc.

The base layer 130 may be used as a raw material for forming the variable resistance element 140, and transmit a voltage or current supplied from the horizontal electrode layer 120 to the variable resistance element 140. For example, the base layer 130 may be formed of a conductive metal-containing layer, for example, a Ti layer, a TiN layer, a Ta layer, etc. The metal-containing layer may be changed to a metal oxide having a variable resistance characteristic when being oxidized. However, other implementations are also possible. The base layer 130 may be formed of various materials as long as the base layer 130 has conductivity and can be changed to a variable resistance material by various treatments. A material used as the base layer 130 may be selected with a focus on a characteristic of the variable resistance element 140 is not limited to being a low resistance material.

The variable resistance element 140 may be interposed between the vertical electrode 150 and the base layer 130, and switched between different resistance states according to a voltage or current supplied from the vertical electrode 150 and supplied from the horizontal electrode layer 120 via the base layer 130. Therefore, the variable resistance element 140 may serve as a memory cell which can store different data. That is, a memory cell may be formed at each intersection of the vertical electrode 150 and the base layer 130. In an implementation in which the variable resistance element 140 of the uppermost structure S surrounding the vertical electrode 150 is in a low resistance state, a current flow is shown by a dotted arrow in FIG. 2B.

The variable resistance element 140 may be obtained by treating the base layer 130. Therefore, the base layer 130 and the variable resistance element 140 may have one or more common elements. The variable resistance element 140 may be located at a same level as the base layer 130 in the vertical direction and have a same thickness as the base layer 130. Also, the variable resistance element 140 may have a ring shape surrounding a sidewall of the vertical electrode 150, and a width of the variable resistance element 140 may have a value selected to satisfy a variable resistance characteristic. For example, when the base layer 130 is a metal-containing layer, the variable resistance element 140 may include an oxide of the metal contained in the base layer 130. In particular, the variable resistance element 140 may include an oxygen-deficient metal oxide containing a large amount of oxygen vacancies.

The oxygen-deficient metal oxide may be deficient in oxygen compared to a metal oxide that satisfies a stoichiometric ratio. For example, when the base layer 130 is a Ti-containing layer such as a Ti layer, a TiN layer and the like, the variable resistance element 140 may include $TiO_x$, where x is smaller than 2. Alternately, when the base layer 130 is a Ta-containing layer, the variable resistance element 140 may include $TaO_y$, where y is smaller than 2.5. In this case, a resistance value of the variable resistance element 140 may change according to whether a filament current path by movement of the oxygen vacancies is present or absent in the variable resistance element 140. That is, when a filament current path is generated by the movement of the oxygen vacancies between the base layer 130 and the vertical electrode 150, the variable resistance element 140 may be in a low resistance state and store data '1'.

On the other hand, when the filament current path is not present, the variable resistance element 140 may be in a high resistance state and store data '0'. In the horizontal direction, a width of the variable resistance element 140 may have a value such that generation of the filament current path is possible. However, other implementations are also possible.

The variable resistance element 140 may be have various forms as long as the variable resistance element 140 can be obtained by a treatment of the base layer 130 and switched between different resistance states according to a voltage or current supplied thereto through the vertical electrode 150 and the horizontal electrode layer 120 via the base layer 130.

A semiconductor device according to FIGS. 2A and 2B may solve several problems associated with the conventional device of FIG. 1. Specifically, the base layer 130 for forming the variable resistance element 140 and the horizontal electrode layer 120 for supplying a voltage or current to the variable resistance element 140 may be formed independently, so material choices for the variable resistance element 140 and the horizontal electrode layer 120 are much greater than a conventional device. That is, it is possible to select an optimal material, for example, a material having an excellent variable resistance characteristic for the variable resistance element 140, and independently from this, it is possible to select an optimal material, for example, a low resistance material for the horizontal electrode layer 120. As a result, a data storage characteristic and an operating characteristic of the semiconductor device may be improved.

Hereinafter, an example of a fabricating method of the semiconductor device of FIGS. 2A and 2B will be described.

Figure 3:
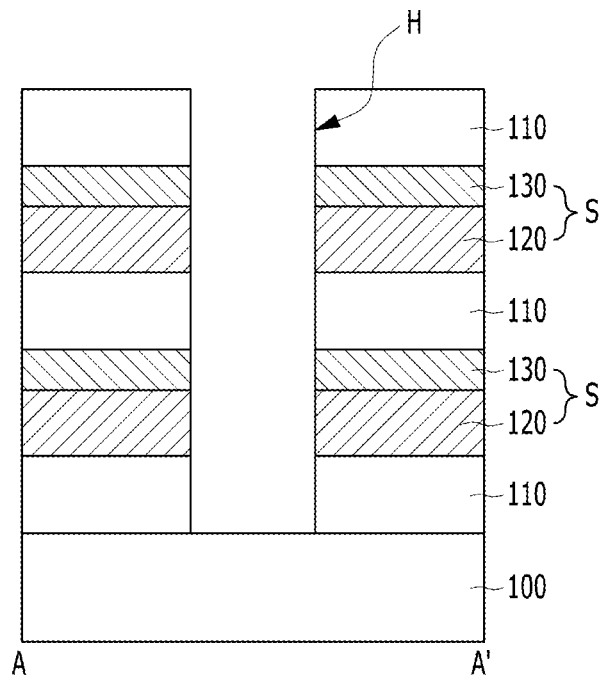
FIGS. 3 to 5 are cross-sectional views illustrating intermediate processing steps for fabricating the semiconductor device of FIGS. 2A and 2B.
Figure 4:
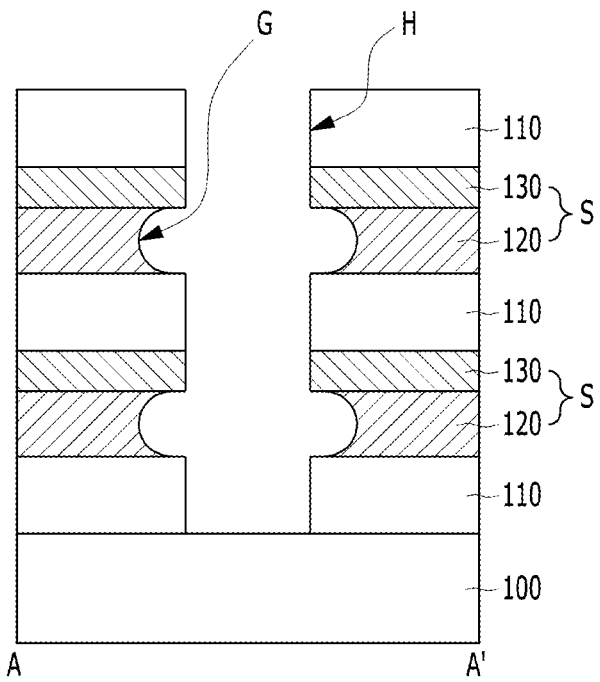
Figure 5:
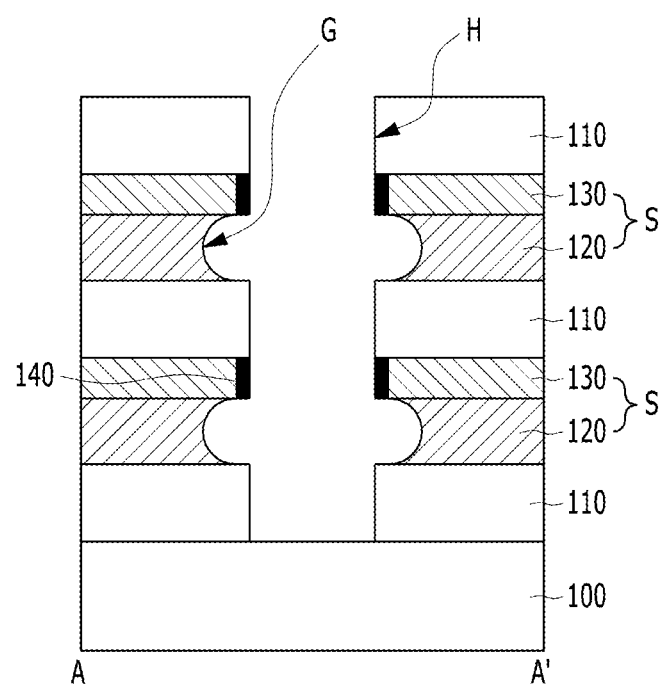

FIGS. 3 to 5 are cross-sectional views illustrating intermediate processing steps for fabricating the semiconductor device of FIGS. 2A and 2B.

Referring to FIG. 3, the interlayer dielectric layer 110 and the structure S in which the horizontal electrode layer 120 and the base layer 130 are sequentially stacked may be alternately stacked over the substrate 100.

Then, the hole H penetrating through the stacked structure of the interlayer dielectric layer 110 and the structure S and exposing a portion of the substrate 100 may be formed by selectively etching the stacked structure of the interlayer dielectric layer 110 and the structure S. The hole H may provide a space in which the vertical electrode 150 is formed. Sidewalls of the interlayer dielectric layer 110, the horizontal electrode layer 120 and the base layer 130 may be exposed by the hole H.

Referring to FIG. 4, the groove G may be formed by removing a portion of the horizontal electrode layer 120 exposed by the hole H. The removal of the portion of the horizontal electrode layer 120 may be performed by an isotropic etching process, for example, a wet etching process. An etching rate of the horizontal electrode layer 120 and an etching rate of the base layer 130 may be significantly different, so the base layer 130 may be relatively unaffected when removing the portion of the horizontal electrode layer 120.

Although not shown, a process of forming an insulating layer filling the groove G may be performed after forming the groove G. The process of forming the insulating layer may be performed by depositing an insulating material having an excellent step coverage characteristic to a thickness sufficient to fill the groove G, and performing a blanket etching process so that the insulating material remains only inside the groove G. In an implementation, the forming process of the insulating layer may be omitted. In such an implementation, the groove G may be in a vacuum state or filled with a gas. Regardless, the inside of the groove G may have an insulating characteristic so that the horizontal electrode layer 120 and the vertical electrode 150 are insulated from each other.

Referring to FIG. 5, a side surface of the base layer 130 may be changed to the variable resistance element 140 by treating a portion of the base layer 130 exposed by the hole H. When the base layer 130 is a metal-containing layer, the treatment may be an oxidation process. As a result, the variable resistance element 140 including a metal oxide may be formed. A width and an oxygen content of the variable resistance element 140 may be controlled by time of the oxidation process or an amount of a gas used in the oxidation process. Therefore, the variable resistance element 140 having a proper width and including an oxygen-deficient metal oxide may be formed.

In this oxidation process, when the horizontal electrode layer 120 is protected by the insulating layer inside the groove G or formed of a material which is not selectively oxidized compared to the base layer 130, the horizontal electrode layer 120 may not be oxidized. However, a side surface of the horizontal electrode layer 120 may be oxidized together with the side surface of the base layer 130. In this case, a remaining portion of the horizontal electrode layer 120 which is not oxidized may be coupled to the base layer 130 and supply a voltage or current to the base layer 130.

Then, referring again to FIGS. 2A and 2B, the vertical electrode 150 filling the hole H may be formed. The forming of the vertical electrode 150 may be performed by depositing a conductive material over a resultant structure of FIG. 5 to a thickness sufficient for filling the hole H, and performing a planarization process, for example, a CMP (Chemical Mechanical Polishing) process until the uppermost interlayer dielectric layer 110 is exposed.

At this time, when the groove G is an empty space, the conductive material for forming the vertical electrode 150 may be formed by an anisotropic deposition. Anisotropic deposition may be used to prevent an electrical short between the vertical electrode 150 and the horizontal electrode layer 120 by a conductive material remaining in the groove G. However, when the groove G is filled with the insulating layer, both the anisotropic deposition and an isotropic deposition may be used.

By the aforementioned processes, the semiconductor device of FIGS. 2A and 2B may be fabricated. However, these processes may be changed in various implementations. For example, in an implementation, the process of forming the groove G of FIG. 4 may be performed after forming the variable resistance element 140.

Figure 6A:
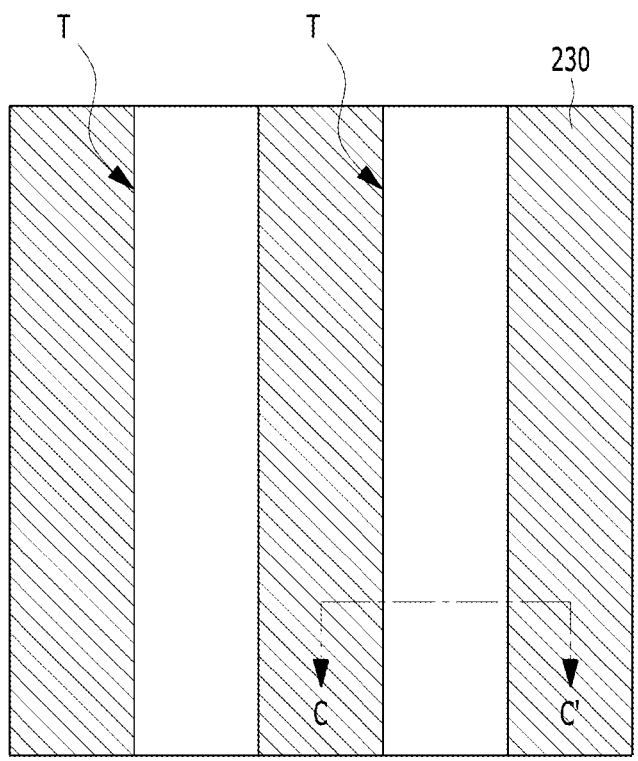
FIGS. 6A to 8B are views illustrating a semiconductor device in accordance with another implementation, and a fabricating method thereof.
Figure 6B:
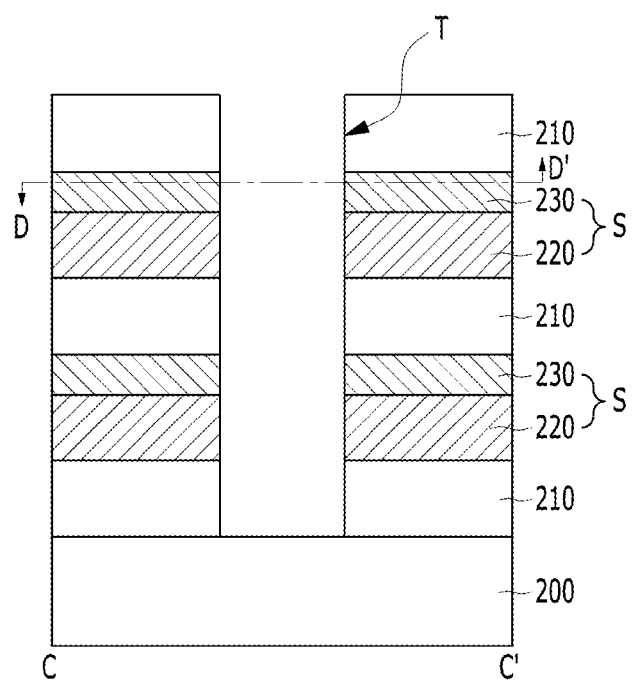
Figure 7A:
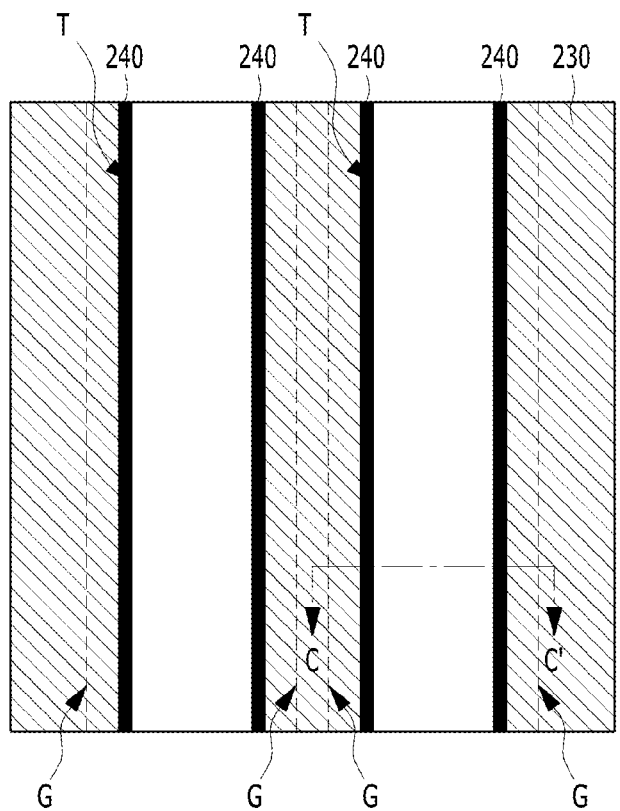
Figure 7B:
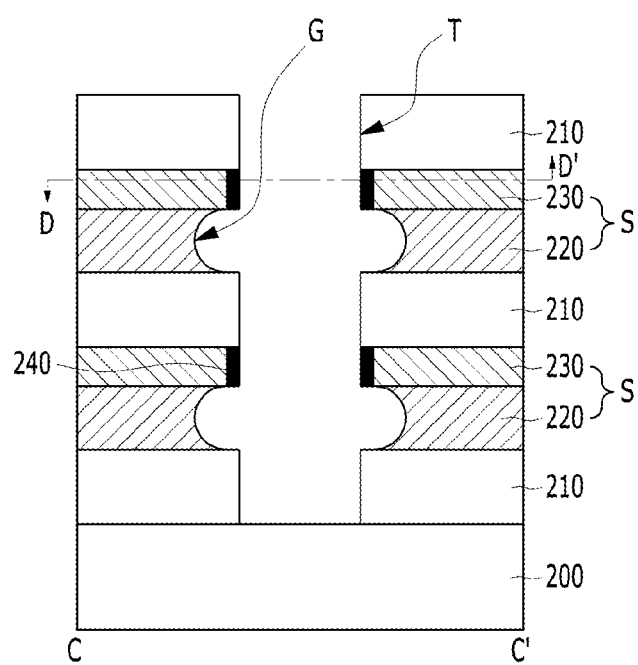
Figure 8A:
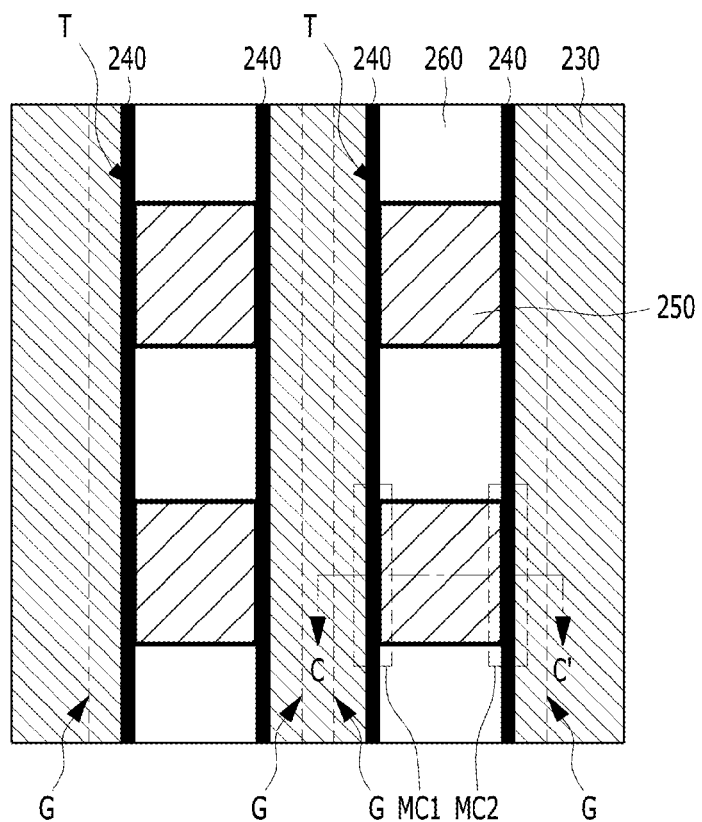
Figure 8B:
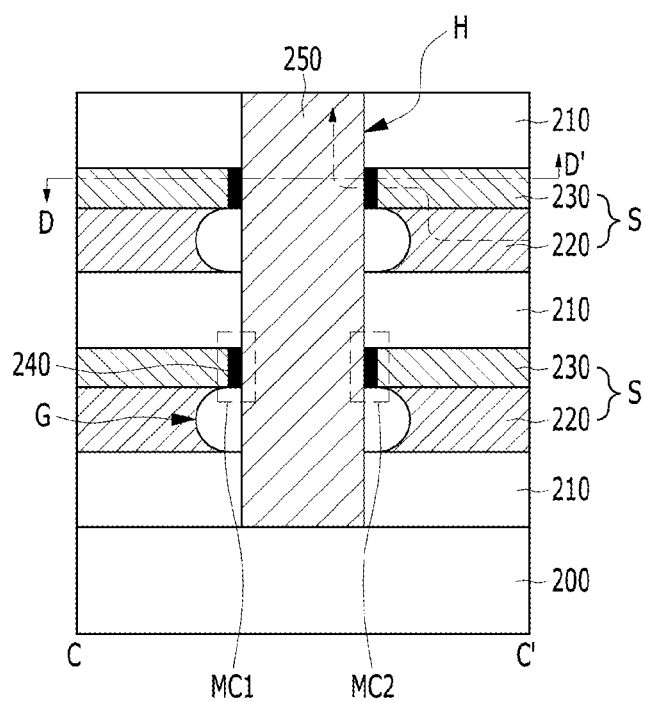

FIGS. 6A to 8B are views illustrating a semiconductor device in accordance with another implementation, and a fabricating method thereof. FIGS. 6A, 7A and 8A are planar views, and FIGS. 6B, 7B and 8B are cross-sectional views taken along lines C-C' of FIGS. 6A, 7A and 8A. In particular, FIGS. 6A, 7A and 8A are shown at a height of lines D-D' of FIGS. 6B, 7B and 8B. The following description focuses on differences from the implementations of FIGS. 3-5.

Referring to FIGS. 6A and 6B, and a structure S in which a horizontal electrode layer 220 and a base layer 230 are sequentially stacked may be alternately stacked with an interlayer dielectric layer 210 over a substrate 200.

Next, a trench T penetrating through the stacked structure of the interlayer dielectric layer 210 and the structure S and exposing a portion of the substrate 200 may be formed by selectively etching the stacked structure of the interlayer dielectric layer 210 and the structure S. The trench T may extend in a first direction crossing the line C-C', which is a horizontal direction in the perspective of FIG. 6B.

Referring to FIGS. 7A and 7B, a groove G may be formed by removing a portion of the horizontal electrode layer 220 exposed by the trench T. Since the trench T extends in the first direction, the groove G may have a line shape extending in the first direction as well.

A portion of the base layer 230 may be changed to a variable resistance element 240 treating a side surface of the base layer 230 exposed by the trench T. Since the trench T extends in the first direction, the variable resistance element 240 may have a line shape extending in the first direction.

Referring to FIGS. 8A and 8B, a vertical electrode 250 and an insulating layer 260 may be formed in the trench T. The vertical electrode 250 may have a pillar shape and fill a portion of the trench T. The insulating layer 260 may fill a remaining portion of the trench T in which the vertical electrode 250 is not formed.

Forming the vertical electrode 250 and the insulating layer 260 may be performed by filling the trench T with an insulating material, selectively etching the insulating material to provide a space in which the vertical electrode 250 is to be formed, and filling the space with a conductive material. Alternately, forming the vertical electrode 250 and the insulating layer 260 may be performed by filling the trench T with a conductive material, selectively etching the conductive material to form the vertical electrode 250, and filling the remaining space of the trench T with an insulating material. The insulating layer 260 may be formed of various insulating materials such as a silicon oxide, a silicon nitride, a combination thereof, etc.

By the aforementioned processes, the semiconductor device of FIGS. 8A and 8B may be fabricated.

Unlike the implementation of FIGS. 3-5, the vertical electrode 250 of the semiconductor device of FIGS. 8A and 8B may have a rectangular pillar shape which has four side surfaces. The variable resistance element 240 coupled to one side surface of the vertical electrode 250 and the variable resistance element 240 coupled to another side surface of the vertical electrode 250 may be separated from each other in a second direction parallel to the line C-C' to form different memory cells. For example, referring to FIG. 8A, the variable resistance element 240 between the vertical electrode 250 and the lowermost structure S located at a left side of this vertical electrode 250 may form a first memory cell MC1, and the variable resistance element 240 between the vertical electrode 250 and the lowermost structure S located at a right side of vertical electrode 250 may form a second memory cell MC2.

Here, the groove G and the variable resistance element 240 extend in the first direction. However, shapes of the groove G and the variable resistance element 240 may be changed according to forming processes thereof. An example of such an implementation will be exemplarily shown in FIGS. 9A to 10B.

Figure 9A:
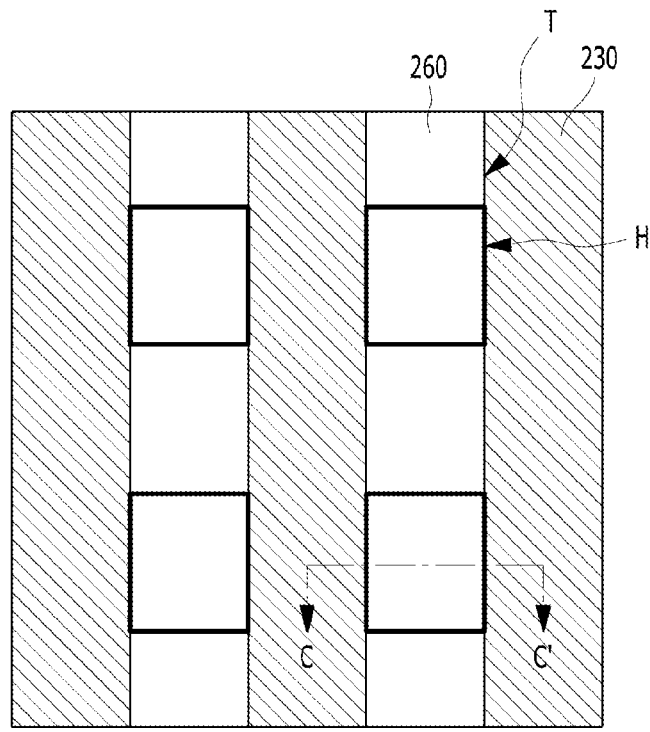
FIGS. 9A to 10B are views illustrating a semiconductor device in accordance with still another implementation, and a fabricating method thereof.
Figure 9B:
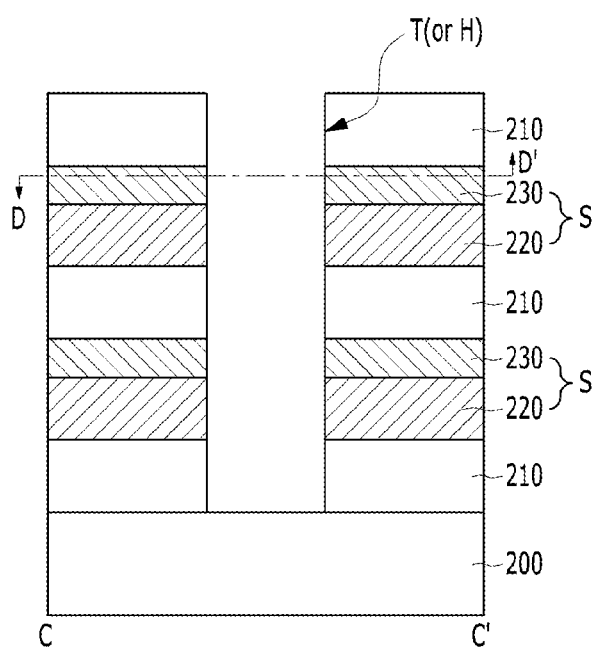
Figure 10A:
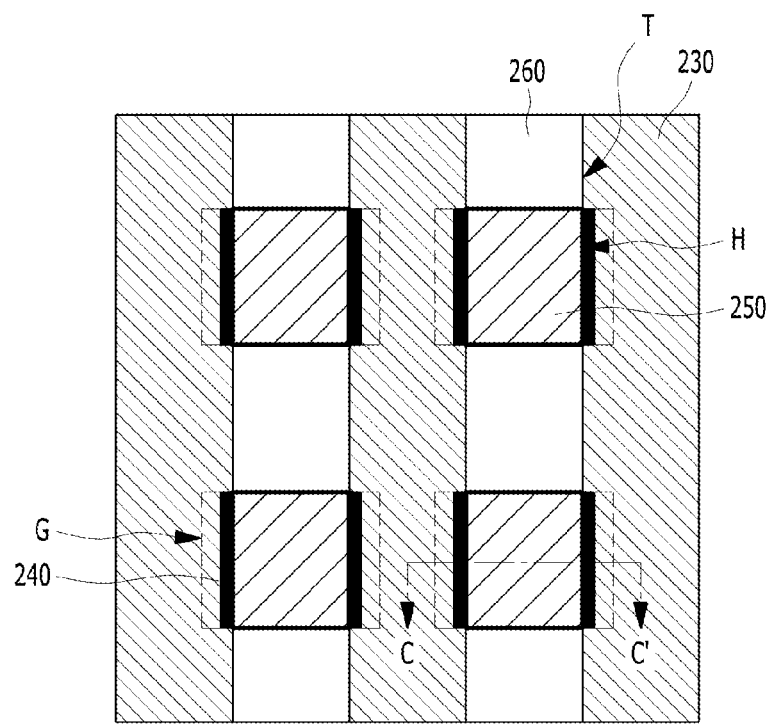
Figure 10B:
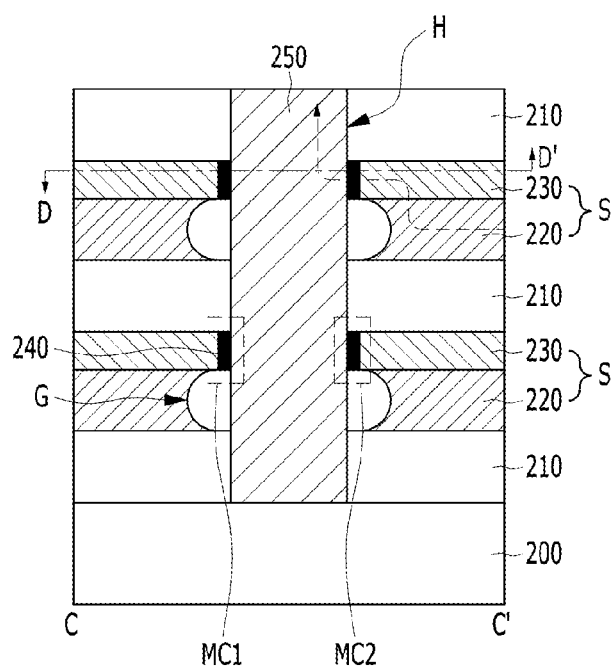

FIGS. 9A to 10B are views illustrating a semiconductor device in accordance with still another implementation, and a fabricating method thereof. FIGS. 9A and 10A are planar views, and FIGS. 9B and 10B are cross-sectional views taken along lines C-C' of FIGS. 9A and 10A. In particular, FIGS. 9A and 10A are shown at a height of lines D-D' of FIGS. 9B and 10B. The following description focuses on differences from the implementations described above.

Referring to FIGS. 9A and 9B, a structure S in which a horizontal electrode layer 220 and a base layer 230 are sequentially stacked may be alternately stacked with an interlayer dielectric layer 210 over a substrate 200.

Next, a trench T penetrating through the stacked structure of the interlayer dielectric layer 210 and the structure S and exposing a portion of the substrate 200 may be formed by selectively etching the stacked structure of the interlayer dielectric layer 210 and the structure S. The trench T may extend in the first direction, which is a horizontal direction in the perspective of FIG. 9B.

An insulating layer 260 filling the trench T may be formed, and then, a hole H providing a space in which a vertical electrode 250 is to be formed may be formed in the insulating layer 260 by selectively etching the insulating layer 260.

Referring to FIGS. 10A and 10B, a groove G may be formed by removing a portion of the horizontal electrode layer 220 exposed by the hole H. Therefore, in the first direction, a width of the groove G may be substantially same as or slightly greater than a width of the hole H.

Also, a portion of the base layer 230 may be changed to a variable resistance element 240 by treating a side surface of the base layer 230 exposed by the hole H. Therefore, in the first direction, a width of the variable resistance element 240 may be substantially same as or slightly greater than the width of the hole H.

The vertical electrode 250 may be formed by filling a conductive material in the hole H.

By the aforementioned processes, the semiconductor device of FIGS. 10A and 10B may be fabricated.

Unlike the other implementations of FIGS. 2-5, the vertical electrode 250 of the semiconductor device of FIGS. 10A and 10B may have a rectangular pillar shape which has four side surfaces. Furthermore, the variable resistance element 240 and the groove G may be formed at regions corresponding to two side surfaces of the vertical electrode 250 in the second direction while not being formed at other regions of the trench.

Meanwhile, in an implementation, the variable resistance element 140 and 240 may be formed by treating a portion of base layers 130 and 230, respectively. However, in other implementations, a variable resistance element may have a multi-layered structure including a plurality of layers, and show a variable resistance characteristic by a combination of the plurality of layers. Such an implementation will be described with reference to FIG. 11.

Figure 11:
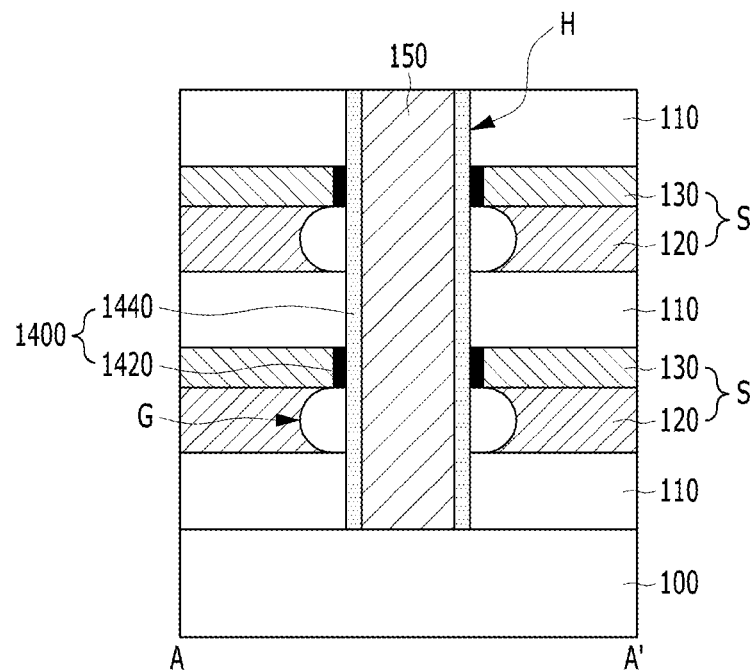
FIG. 11 is a view illustrating a semiconductor device in accordance with still another implementation, and a fabricating method thereof.

FIG. 11 is a view illustrating a semiconductor device in accordance with still another implementation, and a fabricating method thereof.

Referring to FIG. 11, the semiconductor device of this implementation may include a vertical electrode 150 formed over a substrate 100 and extending in a vertical direction perpendicular to a surface of the substrate 100, and an interlayer dielectric layer 110 alternately stacked with a structure S along the vertical electrode 150. The structure S includes a stack structure of a horizontal electrode layer 120 and a base layer 130 which is conductive and can be changed to a variable resistance material by a certain treatment. A variable resistance element 1400 is interposed between the base layer 130 and the vertical electrode 150, and a groove G is interposed between the horizontal electrode layer 120 and the vertical electrode 150.

Here, the variable resistance element 1400 may include a first layer 1420 which is adjacent to the base layer 130 and formed by a treatment to the base layer 130, and a second layer 1440 which is adjacent to the vertical electrode 150 and extends in the vertical direction along the vertical electrode 150. The variable resistance element 1400 may show the variable resistance characteristic by a combination of the first layer 1420 and the second layer 1440. For example, one of the first and second layers 1420 and 1440 may be an oxygen-deficient metal oxide layer containing a large amount of oxygen vacancies, and the other of the first and second layers 1420 and 1440 may be an oxygen-rich metal oxide layer containing a large amount of oxygen compared to the oxygen-deficient metal oxide layer.

The oxygen-deficient metal oxide layer may be formed of a material that is deficient in oxygen compared to a material that satisfies a stoichiometric ratio. For example, the oxygen-deficient metal oxide may include $TiO_x$, where x is smaller than 2, $TaO_y$, where y is smaller than 2.5, or $HfO_z$, where z is smaller than 2. The oxygen-rich metal oxide layer may be formed of a material that satisfies a stoichiometric ratio. For example, the oxygen-rich metal oxide may include $TiO_2$, $Ta_2O_5$, $HfO_2$, etc.

In such an implementation, when a certain voltage is applied to the horizontal electrode layer 120 and the vertical electrode 150, a conductive path by the oxygen vacancies may be formed in the oxygen-rich metal oxide layer because the oxygen vacancies of the oxygen-deficient metal oxide layer are injected into the oxygen-rich metal oxide layer. Therefore, the variable resistance element 1400 may be switched to be in a low resistance state. On the other hand, when a certain voltage having an opposite polarity is applied to the horizontal electrode layer 120 and the vertical electrode 150, the conductive path which is already generated may retract because the oxygen vacancies move toward the oxygen-deficient metal oxide layer. Therefore, the variable resistance element 1400 may be switched to be in a high resistance state.

The variable resistance element 1400 may be formed by performing the aforementioned processes of FIGS. 3 to 5, and forming the second layer 1440 along a sidewall of the hole H. Then, the vertical electrode 150 may be formed by filling the hole H in which the second layer 1440 is formed with a conductive material.

In this figure, the second layer 1440 has a straight line shape in the vertical direction. However, other implementations are also possible. For example, when the groove G is an empty space, the second layer 1440 may have a shape that follows the contour of groove G in a region corresponding to the groove G.

Meanwhile, the semiconductor device may further include a selection element which is coupled to an end of a variable resistance element and controls an access to the variable resistance element, in addition to the variable resistance element. This will be exemplarily described with reference to FIG. 12.

Figure 12:
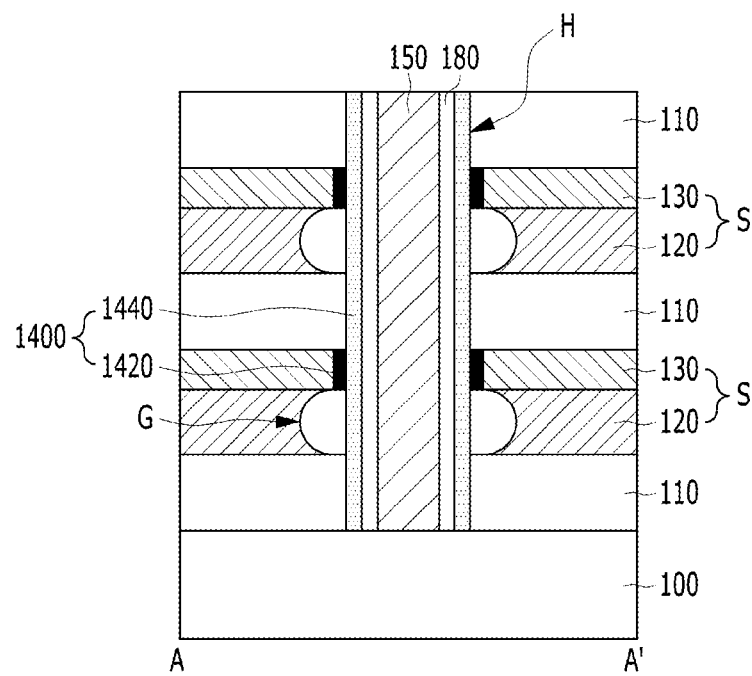
FIG. 12 is a view illustrating a semiconductor device in accordance with still another implementation, and a fabricating method thereof.

FIG. 12 is a view illustrating a semiconductor device in accordance with still another implementation, and a fabricating method thereof.

Referring to FIG. 12, the semiconductor device of this implementation may include a vertical electrode 150 formed over a substrate 100 and extending in a vertical direction perpendicular to a surface of the substrate 100, and an interlayer dielectric layer 110 alternately stacked with a structure S along the vertical electrode 150. The structure S includes a stack structure of a horizontal electrode layer 120 and a base layer 130 which is conductive and can be changed to a variable resistance material by a certain treatment. A variable resistance element 1400 is interposed between the base layer 130 and the vertical electrode 150, a selection element layer 180 is interposed between the variable resistance layer 1400 and the vertical electrode 150, and a groove G is interposed between the horizontal electrode layer 120 and the vertical electrode 150.

Here, the variable resistance element 1400 may include a first layer 1420 which is adjacent to the base layer 130 and formed by treating the base layer 130, and a second layer 1440 which is adjacent to the vertical electrode 150 and extends in the vertical direction along the vertical electrode 150.

The selection element layer 180 may be interposed between the second layer 1440 and the vertical electrode 150, and extend in the vertical direction along the vertical electrode 150. The selection element layer 180 may be a threshold switching element. In a threshold switching layer, when a voltage above a threshold voltage is applied to the threshold switching layer, current readily flows through the threshold switching layer. In contrast, when a voltage below the threshold voltage is applied, no current, or an insubstantial amount of current, flows through the threshold switching layer. The selection element layer 180 may include a diode, an OTS (Ovonic Threshold Switching) material such as a chalcogenide-based material, an MIEC (Mixed Ionic Electronic Conducting) material such as a chalcogenide-based material containing a metal, an MIT (Metal Insulator Transition) material such as $NbO_2$, $VO_2$, a tunneling insulating layer having a relatively wide band gap such as $SiO_2$, $Al_2O_3$, etc.

The variable resistance element 1400 and the selection element layer 180 may be formed by performing the aforementioned processes of FIGS. 3 to 5, and sequentially forming the second layer 1440 and the selection element layer 180 along a sidewall of the hole H. Then, the vertical electrode 150 may be formed by filling the hole H in which the second layer 1440 and the selection element layer 180 are formed with a conductive material.

In the above implementations, it may not be a base layer but a low resistance horizontal electrode layer may serve as a supply path of a voltage or current instead of a base layer. Therefore, the base layer may be in a floating state, and the horizontal electrode layer may be coupled to a voltage supply through various conductive paths. This will be exemplarily shown in FIG. 13.

Figure 13:
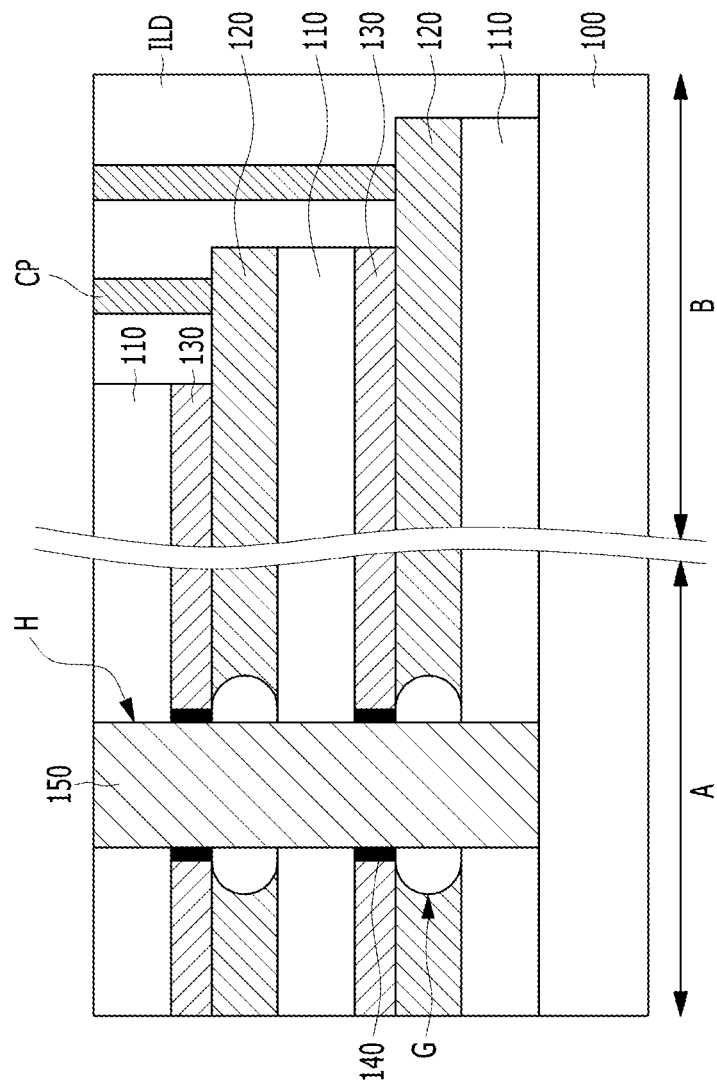
FIG. 13 is a view illustrating a semiconductor device in accordance with still another implementation.

FIG. 13 is a view illustrating a semiconductor device in accordance with still another implementation.

Referring to FIG. 13, the semiconductor device of this implementation may include a cell array region A and a peripheral circuit region B.

In the cell array region A, structures of the aforementioned implementations, for example, the interlayer dielectric layer 110, the horizontal electrode layer 120, the base layer 130, the variable resistance element 140 and the vertical electrode 150 which are shown in FIG. 2B, may be disposed.

Here, a stacked structure of the interlayer dielectric layer 110, the horizontal electrode layer 120 and the base layer 130 may extend to the peripheral circuit region B. The stacked structure of the interlayer dielectric layer 110, the horizontal electrode layer 120 and the base layer 130 may have a stepped shape similar to a stair in the peripheral circuit region B. Specifically, a lower horizontal electrode layer 120 may protrude further in the horizontal direction than the horizontal electrode layer 120 above it. A conductive plug CP may be formed over the end portion of the horizontal electrode layer 120 to couple the horizontal electrode layer 120 with another element. That is, the conductive plug CP may penetrate through an insulating layer ILD covering the peripheral circuit region B, and be coupled to the end portion of the horizontal electrode layer 120.

The above and other memory circuits or semiconductor devices based on the disclosed technology can be used in a range of devices or systems. FIGS. 14-18 provide some examples of devices or systems that can implement a memory circuit in accordance with an embodiment disclosed herein.

Figure 14:
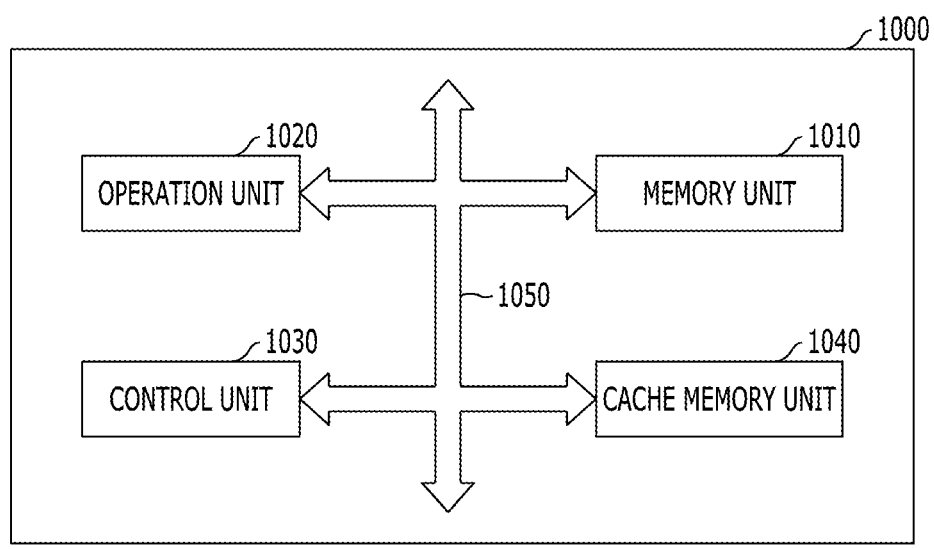
FIG. 14 illustrates a microprocessor implementing memory circuitry based on the disclosed technology.

FIG. 14 illustrates a microprocessor implementing memory circuitry based on the disclosed technology.

Referring to FIG. 14, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with embodiments. For example, the memory unit 1010 may include a vertical electrode layer formed over a substrate and extending in a vertical direction substantially perpendicular to a surface of the substrate; an interlayer dielectric layer and a structure formed over the substrate and alternately stacked along the vertical electrode layer, wherein the structure includes a horizontal electrode layer and a base layer which is conductive and located over or under the horizontal electrode layer; a variable resistance layer interposed between the vertical electrode layer and the base layer, and including a common element with the base layer; and a groove interposed between the vertical electrode layer and the horizontal electrode layer and insulating the vertical electrode layer and the horizontal electrode layer from each other. Through this, an operating characteristic and a data storage characteristic of the memory unit 1010 may be improved. As a consequence, an operating characteristic of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 15:
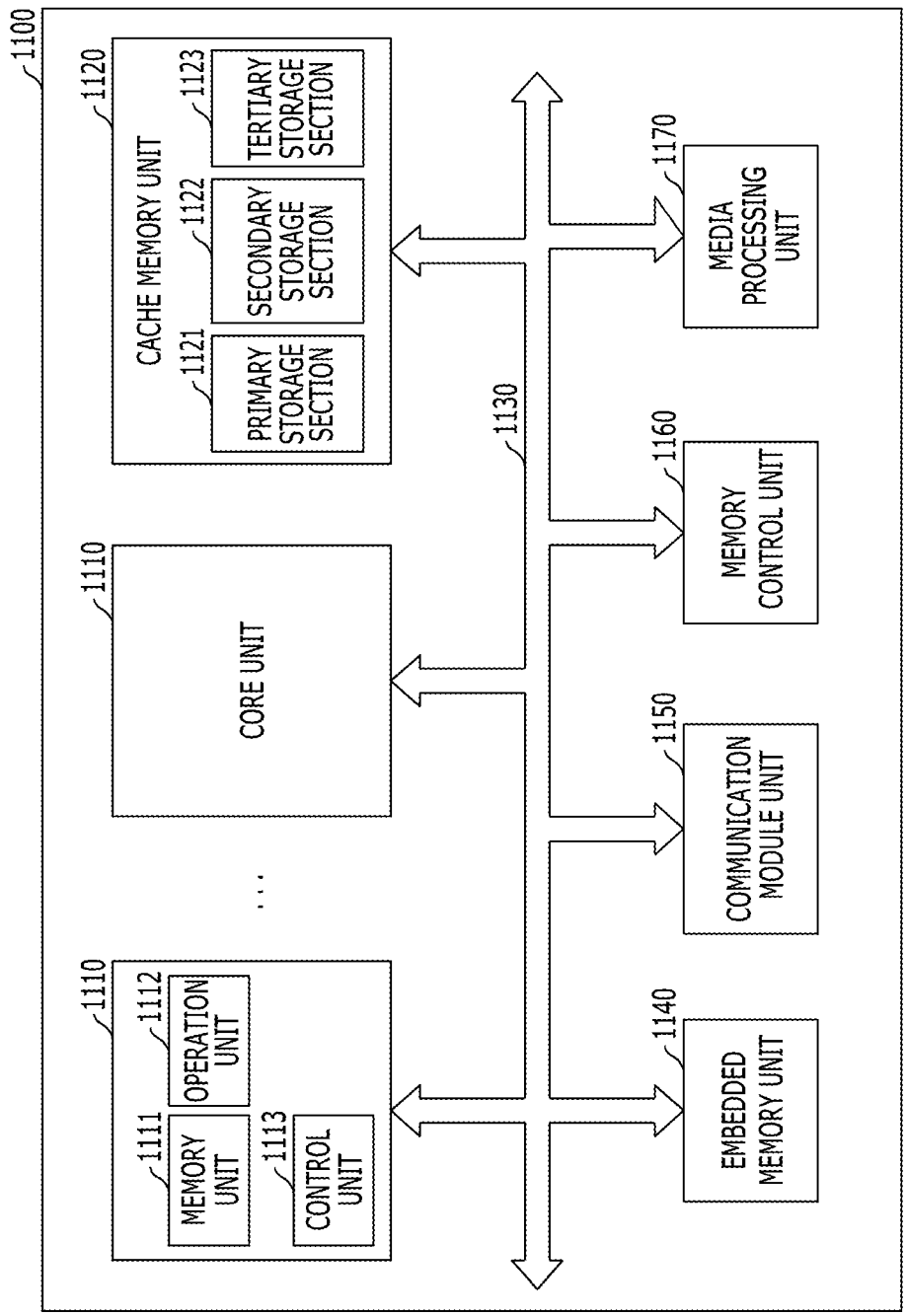
FIG. 15 illustrates a processor implementing memory circuitry based on the disclosed technology.

FIG. 15 illustrates a processor implementing memory circuitry based on the disclosed technology.

Referring to FIG. 15, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a vertical electrode layer formed over a substrate and extending in a vertical direction substantially perpendicular to a surface of the substrate; an interlayer dielectric layer and a structure formed over the substrate and alternately stacked along the vertical electrode layer, wherein the structure includes a horizontal electrode layer and a base layer which is conductive and located over or under the horizontal electrode layer; a variable resistance layer interposed between the vertical electrode layer and the base layer, and including a common element with the base layer; and a groove interposed between the vertical electrode layer and the horizontal electrode layer and insulating the vertical electrode layer and the horizontal electrode layer from each other. Through this, an operating characteristic and a data storage characteristic of the cache memory unit 1120 may be improved. As a consequence, an operating characteristic of the processor 1100 may be improved.

Although it was shown in FIG. 15 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another embodiment, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 16:
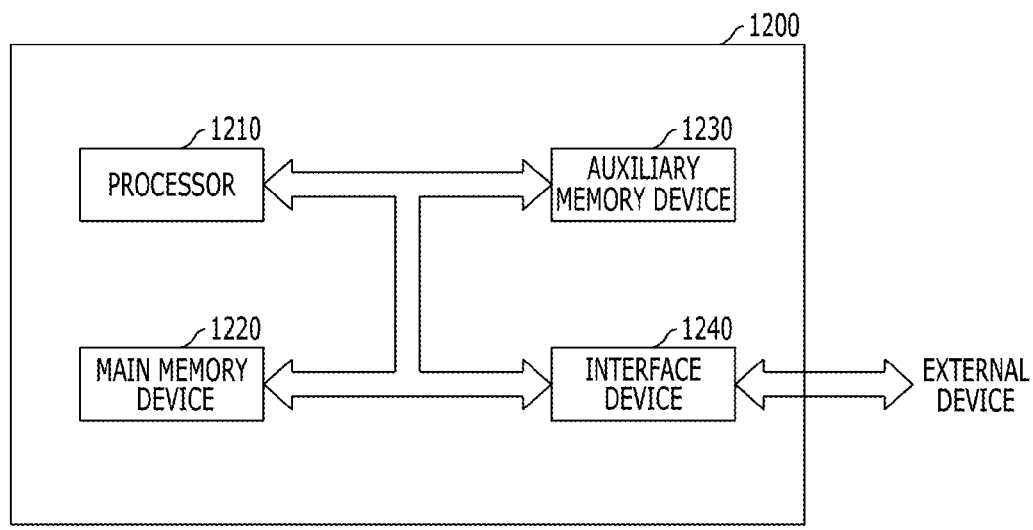
FIG. 16 illustrates a system implementing memory circuitry based on the disclosed technology.

FIG. 16 illustrates a system implementing memory circuitry based on the disclosed technology.

Referring to FIG. 16, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include a vertical electrode layer formed over a substrate and extending in a vertical direction substantially perpendicular to a surface of the substrate; an interlayer dielectric layer and a structure formed over the substrate and alternately stacked along the vertical electrode layer, wherein the structure includes a horizontal electrode layer and a base layer which is conductive and located over or under the horizontal electrode layer; a variable resistance layer interposed between the vertical electrode layer and the base layer, and including a common element with the base layer; and a groove interposed between the vertical electrode layer and the horizontal electrode layer and insulating the vertical electrode layer and the horizontal electrode layer from each other. Through this, an operating characteristic and a data storage characteristic of the main memory device 1220 may be improved. As a consequence, an operating characteristic of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include a vertical electrode layer formed over a substrate and extending in a vertical direction substantially perpendicular to a surface of the substrate; an interlayer dielectric layer and a structure formed over the substrate and alternately stacked along the vertical electrode layer, wherein the structure includes a horizontal electrode layer and a base layer which is conductive and located over or under the horizontal electrode layer; a variable resistance layer interposed between the vertical electrode layer and the base layer, and including a common element with the base layer; and a groove interposed between the vertical electrode layer and the horizontal electrode layer and insulating the vertical electrode layer and the horizontal electrode layer from each other. Through this, an operating characteristic and a data storage characteristic of the auxiliary memory device 1230 may be improved. As a consequence, an operating characteristic of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the embodiments, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 17:
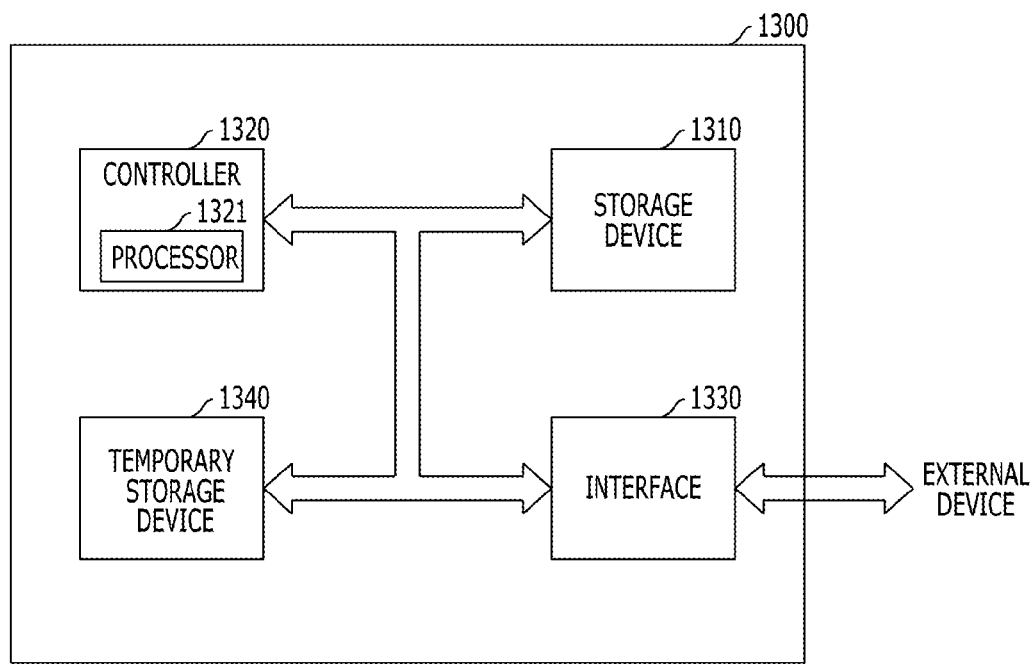
FIG. 17 illustrates a data storage system implementing memory circuitry based on the disclosed technology.

FIG. 17 illustrates a data storage system implementing memory circuitry based on the disclosed technology.

Referring to FIG. 17, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. The temporary storage device 1340 may include a vertical electrode layer formed over a substrate and extending in a vertical direction substantially perpendicular to a surface of the substrate; an interlayer dielectric layer and a structure formed over the substrate and alternately stacked along the vertical electrode layer, wherein the structure includes a horizontal electrode layer and a base layer which is conductive and located over or under the horizontal electrode layer; a variable resistance layer interposed between the vertical electrode layer and the base layer, and including a common element with the base layer; and a groove interposed between the vertical electrode layer and the horizontal electrode layer and insulating the vertical electrode layer and the horizontal electrode layer from each other. Through this, an operating characteristic and a data storage characteristic of the temporary storage device 1340 may be improved. As a consequence, an operating characteristic and a data storage characteristic of the data storage system 1300 may be improved.

Figure 18:
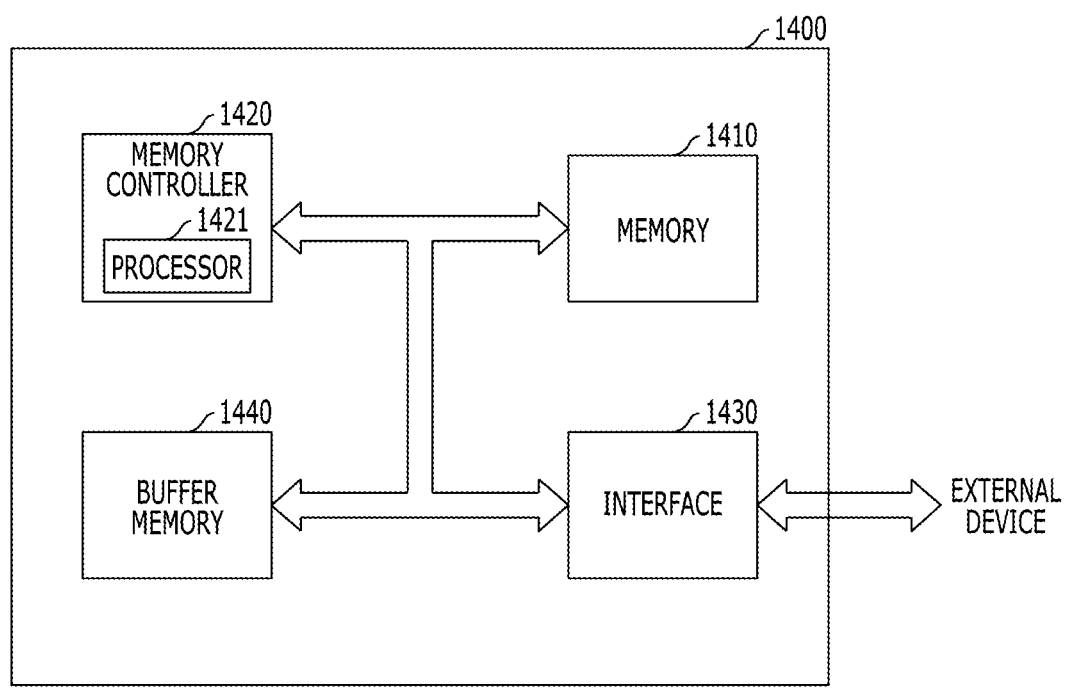
FIG. 18 illustrates a memory system implementing memory circuitry based on the disclosed technology.

FIG. 18 illustrates a memory system implementing memory circuitry based on the disclosed technology.

Referring to FIG. 18, a memory system 1400 may include a memory 1410 which has nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the embodiments. For example, the memory 1410 may include a vertical electrode layer formed over a substrate and extending in a vertical direction substantially perpendicular to a surface of the substrate; an interlayer dielectric layer and a structure formed over the substrate and alternately stacked along the vertical electrode layer, wherein the structure includes a horizontal electrode layer and a base layer which is conductive and located over or under the horizontal electrode layer; a variable resistance layer interposed between the vertical electrode layer and the base layer, and including a common element with the base layer; and a groove interposed between the vertical electrode layer and the horizontal electrode layer and insulating the vertical electrode layer and the horizontal electrode layer from each other. Through this, an operating characteristic and a data storage characteristic of the memory 1410 may be improved. As a consequence, an operating characteristic and a data storage characteristic of the memory system 1400 may be improved.

Also, the memory 1410 according to this embodiment may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this embodiment may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the embodiments. The buffer memory 1440 may include a vertical electrode layer formed over a substrate and extending in a vertical direction substantially perpendicular to a surface of the substrate; an interlayer dielectric layer and a structure formed over the substrate and alternately stacked along the vertical electrode layer, wherein the structure includes a horizontal electrode layer and a base layer which is conductive and located over or under the horizontal electrode layer; a variable resistance layer interposed between the vertical electrode layer and the base layer, and including a common element with the base layer; and a groove interposed between the vertical electrode layer and the horizontal electrode layer and insulating the vertical electrode layer and the horizontal electrode layer from each other. Through this, an operating characteristic and a data storage characteristic of the buffer memory 1440 may be improved. As a consequence, an operating characteristic and a data storage characteristic of the memory system 1400 may be improved.

Moreover, the buffer memory 1440 according to this embodiment may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the embodiments, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 14-18 based on a memory device in accordance with an embodiment disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few embodiments and examples are described. Other embodiments, enhancements and variations can be made based on what is described and illustrated in this disclosure.

What is claimed is:

1. An electronic device comprising a semiconductor memory, the semiconductor memory comprising:
    a vertical electrode formed over a substrate and extending in a vertical direction substantially perpendicular to a surface of the substrate;
    a plurality of interlayer dielectric layers alternately stacked with a plurality of structures along the vertical electrode, wherein the structure includes a horizontal electrode layer and a conductive base layer in contact with the horizontal electrode layer;
    a variable resistance element interposed between the vertical electrode and the base layer, the variable resistance element including a chemical element which is the same as a chemical element in the base layer; and
    a groove interposed between the vertical electrode and the horizontal electrode layer and insulating the vertical electrode from the horizontal electrode layer.

2. The electronic device according to claim 1, wherein the horizontal electrode layer is formed of a material having an etching rate different from an etching rate of the base layer.

3. The electronic device according to claim 1, wherein the groove is in a vacuum state or filled with a gas.

4. The electronic device according to claim 1, wherein the groove is filled with an insulating material.

5. The electronic device according to claim 1, wherein the base layer includes a metal, and
    the variable resistance element includes an oxide of the metal.

6. The electronic device according to claim 5, wherein the oxide of the metal is deficient in oxygen compared to a stoichiometric metal oxide.

7. The electronic device according to claim 1, wherein a width of the groove is larger than a width of the variable resistance element in a horizontal direction substantially parallel to the surface of the substrate.

8. The electronic device according to claim 1, wherein the vertical electrode has a first side surface and a second side surface parallel to the first side surface,
    wherein the electronic device includes a first variable resistance element coupled to the first side surface and a second variable resistance element coupled to the second side surface, and
    wherein the first variable resistance element and the second variable resistance element are included in different memory cells.

9. The electronic device according to claim 1, wherein the variable resistance element includes a first layer adjacent to the base layer and a second layer adjacent to the vertical electrode, and
    the first layer includes the chemical element.

10. The electronic device according to claim 9, wherein one of the first layer and the second layer includes a first metal oxide that satisfies a stoichiometric ratio, and the other of the first layer and the second layer includes a second metal oxide that is deficient in oxygen compared to a stoichiometric metal oxide.

11. The electronic device according to claim 9, wherein the first layer is disposed at a sidewall of the base layer, and
    the second layer extends along the vertical electrode in the vertical direction.

12. The electronic device according to claim 1, wherein the semiconductor memory further comprises:
    a selection element layer interposed between the variable resistance element and the vertical electrode, the selection element layer having a threshold switching characteristic.

13. The electronic device according to claim 12, wherein the selection element layer is formed along the vertical electrode so as to extend in the vertical direction.

14. The electronic device according to claim 1, wherein the base layer is in a floating state, and
    the horizontal electrode layer is coupled to a voltage supply.

15. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is a part of the memory unit in the microprocessor.

16. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is a part of the cache memory unit in the processor.

17. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside, wherein the semiconductor memory is a part of the auxiliary memory device or the main memory device in the processing system.

18. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory is a part of the storage device or the temporary storage device in the data storage system.

19. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory is a part of the memory or the buffer memory in the memory system.

20. A method of fabricating an electronic device comprising a semiconductor memory, the method comprising:
   alternately stacking a plurality of interlayer dielectric layers with a plurality of structures over a substrate, wherein the structure includes a horizontal electrode layer and a conductive base layer in contact with the horizontal electrode layer;
   forming an opening by selectively etching the interlayer dielectric layers and the plurality of structures;
   forming a groove by removing a portion of the horizontal electrode layer exposed by the opening;
   changing a portion of the base layer exposed by the opening to a variable resistance element; and
   forming a vertical electrode filling at least a portion of the opening.

21. The method according to claim 20, wherein forming the groove is performed by an isotropic etching process.

22. The method according to claim 20, further comprising:
   filling the groove with an insulating material.

23. The method according to claim 20, wherein the base layer includes a metal, and
   changing the portion of the base layer is performed by an oxidation process.

24. The method according to claim 20, wherein the opening is a linear trench or a hole.

25. The method according to claim 20, further comprising:
   forming an additional variable resistance element over a sidewall of the opening after changing the portion of the base layer.

26. The method according to claim 20, further comprising:
   forming a selection element layer over a sidewall of the opening after changing the portion of the base layer.

* * * * *